(12) United States Patent
Rende

(10) Patent No.: US 12,366,449 B2
(45) Date of Patent: Jul. 22, 2025

(54) COUPLING DEVICE FOR COUPLING VIBRATION SYSTEMS

(71) Applicant: NORTHROP GRUMMAN LITEF GMBH, Freiburg (DE)

(72) Inventor: Jan Daniel Rende, Herbolzheim (DE)

(73) Assignee: NORTHROP GRUMMAN LITEF GMBH, Freiburg (DE)

( * ) Notice: Subject to any disclaimer, the term of this patent is extended or adjusted under 35 U.S.C. 154(b) by 352 days.

(21) Appl. No.: 17/923,006

(22) PCT Filed: May 4, 2021

(86) PCT No.: PCT/EP2021/061747
§ 371 (c)(1),
(2) Date: Nov. 3, 2022

(87) PCT Pub. No.: WO2021/224273
PCT Pub. Date: Nov. 11, 2021

(65) Prior Publication Data
US 2023/0184552 A1    Jun. 15, 2023

(30) Foreign Application Priority Data
May 6, 2020  (DE) ............. 10 2020 112 261.6

(51) Int. Cl.
*G01C 19/574*  (2012.01)
(52) U.S. Cl.
CPC .................. *G01C 19/574* (2013.01)
(58) Field of Classification Search
CPC .................................................. G01C 19/574
See application file for complete search history.

(56) References Cited

U.S. PATENT DOCUMENTS 6,742,390 B2 * 6/2004 Mochida ............ G01C 19/5719
73/504.04
8,322,213 B2   12/2012 Trusov et al.
(Continued)

FOREIGN PATENT DOCUMENTS

DE         10300682       7/2003
DE         10300682 A1    7/2003
DE     102007030120 A1    1/2009

OTHER PUBLICATIONS

International Preliminary Report On Patentability (IPRP) mailed Nov. 10, 2022.
(Continued)

*Primary Examiner* — Walter L Lindsay, Jr.
*Assistant Examiner* — Andrew V Do
(74) *Attorney, Agent, or Firm* — Tarolli, Sundheim, Covell & Tummino LLP

(57) ABSTRACT

A coupling device (130) for coupling a plurality of vibration systems (110, 120), which are mounted above a substrate (200) in such a manner that said systems can vibrate along a first direction (x) and are offset with respect to one another in a second direction (y) perpendicular to the first direction (x), has a flexural beam spring (135) which can bend in the first direction (x) and can be connected to the vibration systems (110, 120); in this case, connections (112, 122) between the flexural beam springs (135) and the vibration systems (110, 120) are arranged between at least two connection points (140) of the flexural beam springs (135) to the substrate (200) in such a manner that a deflection of the flexural beam springs (135) which is caused by movements of the vibration systems (110, 120) results in a vibration of the flexural beam springs (135) with antinodes of vibration in the region of the connections (112, 122) between the
(Continued)

flexural beam springs (135) and the vibration systems (110, 120).

14 Claims, 3 Drawing Sheets

(56) References Cited

U.S. PATENT DOCUMENTS

| | | | |
|---|---|---|---|
| 9,476,897 B2* | 10/2016 | Jomori | G01P 1/026 |
| 2005/0066726 A1 | 3/2005 | Mochida | |
| 2009/0071247 A1 | 3/2009 | Konaka | |
| 2013/0068018 A1 | 3/2013 | Seeger et al. | |
| 2015/0330783 A1 | 11/2015 | Rocchi et al. | |
| 2018/0017244 A1 | 1/2018 | Smith et al. | |
| 2018/0172445 A1 | 6/2018 | Prikhodko et al. | |
| 2019/0310087 A1 | 10/2019 | Gregory et al. | |

OTHER PUBLICATIONS

International Search Report and Written Opinion issued in connection with corresponding PCT Patent Application No. PCT/EP2021/061747 dated Aug. 2, 2021.

Israeli Office Action for IL application No. 297455, dated Jan. 27, 2025, 4 pages.

* cited by examiner

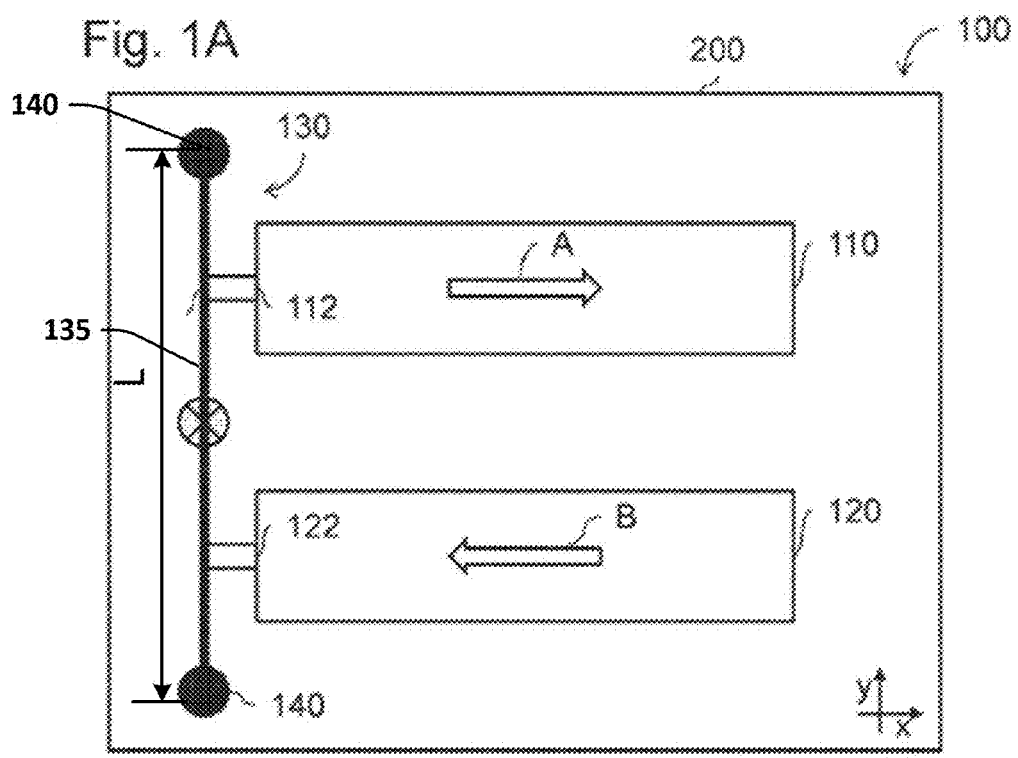
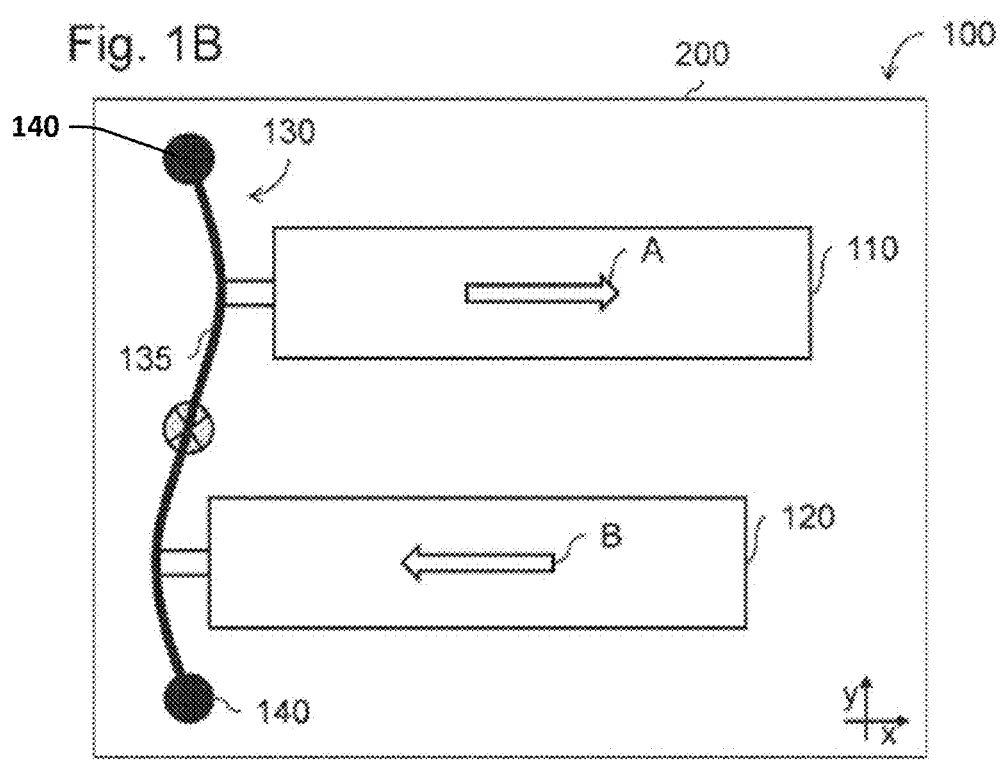

COUPLING DEVICE FOR COUPLING VIBRATION SYSTEMS

RELATED APPLICATIONS

The present invention is a U.S. National Stage Patent Application claiming priority to PCT Application No. PCT/EP2021/061747, filed on May 4, 2021, which claims priority from German Patent Application No. 10 2020 112 261.6, filed on May 6, 2020; the entireties of both are hereby incorporated herein by reference.

The present invention relates to coupling devices for coupling vibration systems. In particular, the invention relates to micro-electro-mechanical components, such as inertial sensors, especially, rotation rate sensors, with multiple vibration systems that are coupled mechanically.

Modern micro-electro-mechanical systems (MEMS), such as inertial sensors, especially, rotation rate sensors, often include multiple vibration systems that vibrate in push-pull mode. This is sometimes used to make the forces and torque acting on the vibrating masses present in the vibration systems symmetrical in such a manner that the system is outwardly free of force and torque, at least in the time average.

It is known, for example, guiding two masses in opposite directions on one line. Various coupling mechanisms are known for such "dual mass sensors", which provide for vibration free of force and torque in the time average.

A problem arises, however, if multiple vibration systems are to be used which vibrate along the same direction, but are not arranged one after another in the direction of vibration, but in parallel. This is, particularly, the case for so-called "quad mass sensors", i.e., for rotation rate sensors that have four vibrating masses. These are paired to form two dual mass sensors, and each of the dual mass sensors can itself be coupled in the manner known. In addition to coupling the vibrating masses of the individual dual mass sensors in push-pull mode, the masses of the two dual mass sensors should also always be moved in push-pull mode, since this minimizes the total forces or torque. In addition, the movement of all masses should often be as one-dimensional as possible.

Prior art solutions to this problem couple the two dual mass sensors to one another by means of lever or rocker constructions. However, such constructions have the disadvantage that the ends of the levers do not describe straight-line trajectories, but circular trajectories due to the rigid design of the levers. The use of such levers thus pulls the coupled vibration systems out of their desired linear movement, especially for particularly preferred larger deflections of the vibration systems. Lever devices for the coupling of vibration systems thus systematically lead to an unwanted deflection of the vibrating masses from a purely linear movement and can also hinder the running of the masses in push-pull mode. These systematic errors lead to a deterioration of the measurement results, which can only be compensated for in a costly manner.

Therefore, the object of the present invention is to specify a coupling device for coupling at least two vibration systems, with which a movement of the vibration systems in the opposite direction can be reliably guided. A further object of the invention is to provide micro-electro-mechanical components, such as inertial/rotation rate sensors, which include such coupled vibration systems. This object is achieved by the subject matter of the claims.

A coupling device for coupling a plurality of vibration systems, which are mounted above a substrate in such a manner that said systems can vibrate along a first direction and are offset with respect to one another in a second direction perpendicular to the first direction, can comprise a bending beam spring which can bend in the first direction and can be connected to the vibration systems. Connections of the bending beam spring to the vibration systems are arranged between at least two connection points of the bending beam spring to the substrate in such a manner that a deflection of the bending beam spring which is caused by movements of the vibration systems results in a vibration of the bending beam spring with vibration antinodes in the area of the connections of the bending beam spring to the vibration systems.

This ensures that vibration systems arranged adjacent to one another in the y-direction and coupled by means of the coupling device are stabilized in their movement in push-pull mode when the latter has first initiated a vibration of the bending beam spring, since the vibration systems are connected to the bending beam in the area of oppositely vibrating vibration antinodes. The connections are optimally arranged at the points of maximum deflection. It can be helpful for the initiation of a vibration mode with two vibration antinodes, for example, if two vibration systems vibrate in push-pull mode with the natural frequency of the corresponding vibration mode. Generalizing the system to a plurality of vibration systems coupled via the bending beam spring, it is advantageous to have an arrangement of connections to the bending beam spring and/or an initiation of vibration in which a vibration antinode is created in the area of each connection. In this way, vibration systems can be effectively coupled to one another in such a manner that a push-pull movement can be supported by adjacent vibration systems. In addition, if, for example, only every next but one vibration antinode of the bending beam spring is connected to a vibration system, a synchronous vibration can also be achieved, or, in the case of irregular distribution of the vibration systems, a mixed opposite and same direction vibration can be achieved.

A micro-electro-mechanical component, preferably an inertial sensor, more preferably a rotation rate sensor for measuring a rotation of the rotation rate sensor, can include the coupling device as described above and the plurality of vibration systems. The number of vibration systems is N, and a length of the bending beam spring between two connection points to the substrate is L. The vibration system $n$ ($n=1, \ldots, N$) is then connected to the bending beam spring at $(2n-1) L/(2N)$. This simplifies the formation of N vibration antinodes and thus the push-pull coupling.

Alternatively, the coupling device can couple at least a first vibration system and a second vibration system to one another. In doing so, the bending beam spring extends along the second direction and can be connected to the substrate at least three connection points, to the first vibration system between one pair of adjacent connection points, and to the second vibration system between the other pair of adjacent connection points. The coupling device is suitable for guiding opposite direction vibrations of the first vibration system and the second vibration system coupled along the first direction.

In particular, a micro-electro-mechanical component such as an inertial sensor or a rotation rate sensor for measuring a rotation of the rotation rate sensor or an object connected to the rotation rate sensor can include the coupling device described above, as well as the first vibration system and the second vibration system. In doing so, the coupling device is connected to the substrate at three connection points and is connected to the first vibration system between one pair of adjacent connection points and to the second vibration system between the other pair of adjacent connection points.

Thus, a micro-electro-mechanical component, such as a rotation rate sensor, has two vibration systems that are required for the micro-electro-mechanical component to function, e.g., to determine the rate of rotation of the sensor. In principle, these can be of any design as long as they are able to vibrate in opposite directions in a first direction and are arranged next to one another with an offset in another second direction perpendicular to this. The lines of movement of the vibration systems can be offset or even tilted with respect to one another. For example, the two vibrating systems can be dual mass rotation rate sensors connected to form a quad mass sensor.

In contrast to the prior art, no rigid lever is used to connect the two vibration systems with one another, but a coupling device with a bending beam spring. The bending beam spring is connected to the substrate of the sensor at three points. Between each of these connection points is the connection to the vibration systems, preferably midway between the connection points.

Now, if a vibration in the first direction is initiated in one (or both) of the vibration systems, that part of the bending beam spring that is connected to the vibration system is correspondingly pulled in the first direction, while it is essentially fixed to the substrate at the two connection points. Due to the one-dimensional deflectability of the bending beam spring, the area with the connection to the other vibration system is thereby moved in the opposite direction, or a corresponding movement initiated in the vibration system is supported and stabilized. The coupling device is therefore suitable for guiding the vibration systems coupled.

The decisive factor here is the use of the bending beam spring as a coupling element, since the deformability of the bending beam spring in the first direction enables linear movement without a circular portion. This is not possible with a lever mechanism as known from the prior art. For this reason, the bending beam spring also allows larger deflections of the vibration systems than a lever mechanism, since the greater the movement of the lever, the more significant the deviation from the linear movement when using levers. This limits the technically reasonable deflection of the coupled vibration systems, a limitation which does in principle not occur for the bending beam spring.

Thus, the use of a suitable bending beam spring connected to the substrate makes it possible to achieve a coupling between two vibration systems that does not lead to a deviation of the vibration systems from the intended movement in opposite directions. This increases the reliability of the sensor. In addition, the vibration systems can vibrate with a greater amplitude, which increases the signal strength of the measured signals. This, in turn, leads to more sensitive sensors.

When the first vibration system and the second vibration system vibrate in opposite directions along the first direction, the coupling device can force them to move in push-pull mode, preferably in parallel. Thus, a strictly opposite direction movement is supported or brought about. In addition, movement components deviating from the first direction can be reduced or deleted by deflecting the bending beam spring. The coupling device can thus force the two vibration systems onto parallel trajectories. These measures can further improve the vibration behavior, making the micro-electro-mechanical component more reliable.

The coupling device can force the first and second vibration systems to vibrate with amplitudes equal in magnitude and in opposite directions. This ensures that the coupled vibration systems are as free of force and torque as possible, since spring forces and torque occurring in the first vibration system compensate for spring forces and torque occurring in the second vibration system if both vibrations vibrate exactly in push-pull mode, i.e., with the same magnitude of amplitude but opposite deflection along the first direction.

The coupling device can further include first, second and third torsion spring elements. In doing so, the first torsion spring element connects a first end of the bending beam spring, the second torsion spring element connects the center of the bending beam spring, and the third torsion spring element connects a second end of the bending beam spring to the substrate. In addition, the first vibration system is connected to the bending beam spring midway between the first and second torsion spring elements, and the second vibration system is connected to the bending beam spring midway between the second and third torsion spring elements. As a result, when the first and second vibration systems are deflected in opposite directions along the first direction, the second mode of the bending beam spring forms as the first mode of the coupling device and forces the first and second vibration systems to move in opposite, preferably parallel, directions.

By using torsion spring elements for the connection between the bending beam spring and the substrate, the bending beam spring is rotatably supported in the connection points. This allows the bending beam spring to bend more in the direction of the deflection of the adjacent vibration system at the connection points. The bending beam spring thus takes an S-shaped form for the coupling, since it is (essentially) spatially fixed at its end points and center point, but is rotatably connected to the substrate. This S-shaped form corresponds to the second mode of a freely vibrating bending beam spring. In the following text, a bending beam spring consisting of several segments, which is subdivided by the torsion spring elements, for example, is also to be understood as a single bending beam spring. The reference to the second mode above thus relates to the entire part of the bending beam spring located between the outer connection points.

In doing so, the center points between the connections to the substrate form points of largest deflection, which also have diametrically opposed amplitudes and move in a purely rectilinear and parallel manner. The movement of the bending beam spring can, in particular, correspond to a stationary wave with fixed end points and a fixed center point.

Since the vibration systems are connected to the bending beam spring at the points of largest deflection, the movements of the vibration systems are also forced onto linear and parallel trajectories. The use of torsion springs therefore improves the guided deflection of the vibration systems and thus the reliability and accuracy of the rotation rate sensor.

With the first and second vibration systems deflecting in opposite directions, forces on the bending beam spring can produce a first torque M1 on the first torsion spring element, a second torque M2 on the second torsion spring element, and a third torque M3 on the third torsion spring element. The first torsion spring element can have a first spring constant K1 with respect to rotation, the second torsion spring element can have a second spring constant K2 with respect to rotation, and the third torsion spring element can have a third spring constant K3 with respect to rotation, wherein the following relationship applies: $K1:K2:K3=M1:M2:M3$.

The first vibration system connected between the first and second torsion spring elements exerts a force on the bending beam spring due to the vibration initiated therein. This force is transmitted to the first torsion spring element and the second torsion spring element via the bending beam spring and produces torque therein in each case. In the opposite direction, the second vibration system exerts an opposite force on the second and third torsion spring elements and also produces torque therein. This torque must be absorbed by the torsion spring elements, which leads to deformation of the torsion spring elements, in particular, to a twisting. In order to achieve a particularly symmetrical bending of the bending beam spring, the spring constants with respect to rotations, i.e., the torsional stiffness of the torsion spring elements with respect to these deformations, should be in the same ratio to one another as the torque exerted on the torsion spring elements by the vibration systems as a whole.

In particular, the first and third torsion spring elements can have the same spring constant with respect to rotations K1=K3, and the second torsion spring element can have a spring constant with respect to rotations K2 that is twice as large as the spring constant of the outer torsion spring elements, i.e., K1:K2:K3=1:2:1 applies. This is particularly suitable for a symmetrical design in which the vibration systems are connected to the bending beam spring exactly midway between two torsion spring elements, and the two sections of the bending beam spring between the central torsion spring element and the two outer torsion spring elements are the same. In this case, the torque acting on the central, i.e., second, torsion spring element doubles up with respect to the torque acting on the outside. This can be countered by the particularly simple ratio of K1:K2:K3=1: 2:1, for which, in this case, an exactly synchronous movement in push-pull mode results for the vibration systems.

The torsion spring elements can be twisted with respect to the substrate, as well as moved linearly with respect to the substrate. This can make sense if the bending beam spring is not ductile enough to be able to provide the change in length required due to the deformation and the tight connection to the substrate. In this case, in addition to rotation, the torsion spring element can also produce deformation along the second direction, causing the sections of the bending beam spring located between the torsion spring elements to "elongate". The bending beam spring then does not consist of a continuous bending beam, but of two (or more) parts connected at their ends to the torsion spring elements. Both parts together are herein referred to as bending beam springs.

The linear deformability of the torsion spring elements thus leads to a linear displacement of the connection point between the bending beam spring and the torsion spring element with respect to the substrate. This also allows the use of bending beams that deform without a change in length, since the required change in length is replaced by the displacement of the connection point. This allows the micro-electro-mechanical component to be made of a material that is advantageous for its functionality without having to consider its elastic properties. This also improves the reliability of the micro-electro-mechanical component.

The torsion spring elements can have a size of less than 1000 μm, 500 μm, 150 μm, 100 μm, 50 μm, 30 μm, 10 μm or 5 μm. The smaller the torsion spring elements, the closer the first mode of the coupling device comes to a sinusoidal vibration with exactly parallel and counter-moving points of maximum deflection. Smaller torsion spring elements therefore improve the deflection of the vibration systems and thus the reliability of the micro-electro-mechanical component.

The connections between the first and second vibration systems and the coupling device along the second direction can have a width that is less than 250 μm, 200 μm, 150 μm, 100 μm, 50 μm, 30 μm, 10 μm, 5 μm or 1 μm. In the area of the connections to the vibration systems, the deformability of the bending beam spring is changed. The narrower this area, i.e., the more uniform the deformability of the bending beam spring, the purer a sinusoidal vibration can form, which improves the micro-electro-mechanical component for the reasons mentioned above.

The micro-electro-mechanical component can have another coupling device that is identical in structure to the previously described coupling device. In doing so, the first and second vibration systems are arranged between the two coupling devices along the first direction, and the two coupling devices are connected to the first and second vibration systems in the same manner. The guidance or coupling of the vibration systems thus takes place from two sides opposite one another along the direction of vibration. This improves the guidance and thus the linearity of the vibration.

The first and second vibration systems can each have two masses that can be initiated to vibrate in opposite directions along the first direction. A rotation with initiated vibration along the first direction releases a Coriolis force acting on the masses along the second direction, the magnitude of which can be measured to infer the rate of rotation. The first and second vibration systems have an identical and symmetrical structure, due to which the micro-electro-mechanical component as a whole is free of force and torque at least in the time average when vibration of the masses has been initiated.

The two vibration systems are thus configured as dual mass rotation rate sensors with two masses that can be initiated to vibrate in push-pull mode within one vibration system. In addition, the masses of the two dual mass sensors also vibrate in relation to one another in push-pull mode. Forces acting outwardly are then always compensated for by correspondingly large forces acting inwardly. A rotation of the quad mass rotation rate sensor produced by this arrangement thereby results in Coriolis forces on all masses. These forces also compensate one another exactly. In the time average, the rotation rate sensor is therefore free of force and torque. This is supported by the coupling devices described above, as they provide for a coupled, linear movement in push-pull mode.

The present invention is to be described in more detail below with reference to the accompanying figures. However, this description is purely exemplary. The invention is defined exclusively by the subject matter of the claims.

FIGS. 1A and 1B show schematic diagrams of a coupling device;

Figure 2:
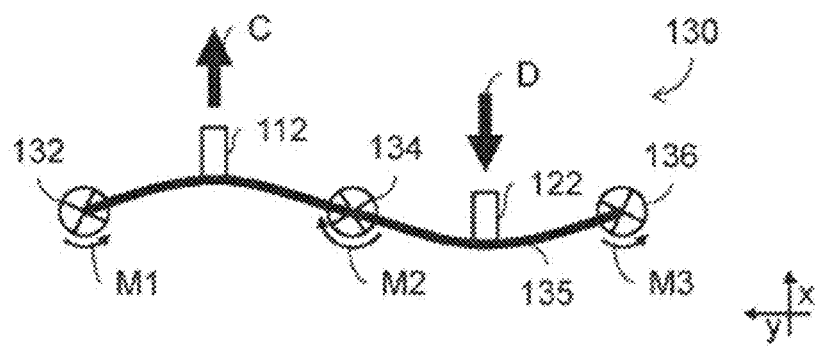
FIG. 2 shows a schematic diagram of a coupling device.

FIGS. 1A and 1B schematically show a micro-electro-mechanical component, such as an inertial sensor or a rotation rate sensor 100, which are configured as micro-electro-mechanical systems (MEMS). In the following text, reference is always made to a rotation rate sensor 100 for the purpose of simplification, but this is not intended to be restrictive.

The rotation rate sensor 100 is capable of detecting rotation around an axis perpendicular to the image plane. To this end, the rotation rate sensor 100 has a first vibration system 110 and a second vibration system 120 that is mounted above a substrate 200 of the rotation rate sensor 100.

These two vibration systems 110, 120 are shown in highly schematized form in FIGS. 1A and 1B. Both vibration systems 110, 120 have components that are movable with respect to the substrate in a first direction, as shown by arrows A and B in FIGS. 1A and 1B. In FIGS. 1A and 1B, the first direction corresponds to the x-direction and the x-axis, respectively. The movement of the components of the vibration systems 110, 120 along the x-direction makes it possible to determine rotation rates in the manner known via the impacts of the Coriolis force, either for each vibration system 110, 120 separately or by combining both vibration systems 110, 120. Since this is sufficiently known, the internal structure of the vibration systems 110, 120 need not be explained in more detail here. In principle, it can correspond to any structure suitable for rotation rate measurement. Also, vibration systems with a similar path of movement can be included in other micro-electro-mechanical components that fulfill a different purpose.

The decisive factor is that the first vibration system 110 and the second vibration system 120 must be deflected in opposite directions along the first direction x for optimal operation of the micro-electro-mechanical component and the rotation rate sensor 100, respectively. "In opposite directions" here includes both opposite movements purely in the x-direction and opposite movements that are tilted against the x-direction and toward one another. Preferably, however, both vibration systems run linearly and in parallel along the x-direction. This means that while the first vibration system 110 (or parts thereof relevant to rotation rate measurement) moves to the right in FIG. 1A, the second vibration system 120 (or parts thereof relevant to rotation rate measurement) moves to the left, and vice versa. Although the respective movements or vibrations of the vibration systems 110, 120 can be initiated by mechanisms arranged in the vibration systems 110, 120, such as pairs of driving electrodes, a mechanical coupling between the vibrating bodies is advantageous to safely guide the opposite direction movement, if possible, in push-pull mode.

As shown in FIG. 1A, the first and second vibration systems 110, 120 are arranged side by side perpendicular to the first direction, i.e., along the y-direction, i.e., they are parallel to one another and offset from one another in the y-direction. Therefore, coupling mechanisms known from the prior art that are suitable for coupling along the direction of movement of vibrations cannot be used for rotation rate sensors 100 such as those of interest in the present case. Rather, the coupling must be provided by a coupling device 130 extending along the y-direction, i.e., along a second direction perpendicular to the first direction. In doing so, the coupling device 130 does not have to follow the second direction in a purely linear or rectilinear manner, but can also have segments that are inclined with regard to the second direction, i.e., run at an angle or even perpendicular to the second direction, for example. The decisive factor is that the coupling device 130 is capable of coupling vibration systems 110, 120 that are arranged offset in the y-direction to one another.

To enable this coupling, the movement occurring within the vibration systems 110, 120 must be mechanically detectable from outside the vibration systems 110, 120, since otherwise a connection to the coupling device 130 is not possible. This is depicted in FIGS. 1A and 1B by the displacement of the entire block representing the vibration system 110, 120. However, this only serves to simplify the description and may not be understood as restrictive. Whenever, in the following text, reference is made to the movement or vibration of a vibration system 110, 120 or its connection to the coupling device 130, this is to be understood as a statement about the components moving within the vibration system 110, 120 which are to be brought into push-pull mode by the coupling device 130.

As depicted in FIGS. 1A and 1B, the coupling device 130 includes a bending beam spring 135 connected to the vibration systems 110, 120. In doing so, the bending beam spring 135 is capable of being deflected in the x-direction. It has a stiffness in the x-direction, which can be less than the stiffness against movements in other directions. The bending beam spring 135 can be composed of multiple segments, e.g., of multiple bending beams, and, in principle, can also have subsections that can be deformed perpendicular to the x-direction, e.g., to bring about a change in the length of the bending beam spring 135.

The bending beam spring 135 can be connected to the substrate 200 at least three connection points 140, i.e., the mobility of the bending beam spring 135 in the x-direction and the y-direction is strongly restricted at the connection points 140. Ideally, the bending beam spring 135 cannot move in the x and y-directions at the connection points 140. However, the bending beam spring 135 can ideally still be rotated above the connection points 140. In principle, however, the central connection point 140, shown hatched, can also be omitted.

Between each two pairs of the three connection points 140 are connections 112, 122 to the two vibration systems 110, 120. The connections can have any shape that is advantageous for connecting the bending beam spring 135 and the vibration systems 110, 120. For example, the bending beam spring 135 can also be more solid or flexible in the area of the connections 112, 122 than in other areas or can be formed with multiple, possibly parallel segments. Also, the bending beam spring 135 can be straight or bent in the area of the connections 112, 122 if this allows an improved connection to the vibration systems 110, 120.

A deflection of the vibration systems 110, 120 results in a bulging of the bending beam spring 135 in the direction of deflection, as shown in FIG. 1B. Due to the rotatable connection of the bending beam spring 135 to the substrate, a deflection to the right in the upper half of the bending beam spring 135 results in a deflection to the left in the lower half. This is because the rotatable mounting at the central connection point 140 means that no force acts on the bending beam spring 135 in this area, resulting in a deviation from a first order straight line course of the bending beam spring 135 in this area. However, the bending beam spring 135 is fixed at the lower connection point 140.

If the first vibration system 110 now pulls the bending beam spring 135 in its upper half to the right, the bending beam spring 135 bends in such a manner that it runs in a substantially straight line from the upper right to the lower left in its central area, and then bends back to the right in the direction of the lower connection point 140. The bending beam spring 135 thus bulges to the left in the lower area, forcing the second vibration system 120 to follow this movement, as shown in FIG. 1B. In this way, the coupling device guides the two vibration systems 110, 120 in their opposite movement, ideally always in push-pull mode.

Advantageous is a symmetrical structure as shown in FIGS. 1A and 1B, in which the outer connection points 140 are connected to the ends of the bending beam spring 135, and the central connection point 140 is located exactly in the middle of the bending beam spring 135. The connections 112, 122 to the vibration systems 110, 120 are then located at one quarter or three quarters length of the bending beam spring 135 and exactly between the respective connection points 140, respectively.

The bending beam spring 135 then has a uniform thickness over its length and can thus have a uniform spring constant. Due to this symmetrical structure, the vibration systems 110, 120 always displace with a diametrically opposed amplitude and phase, i.e., the amount of deflection is the same and the direction of deflection is different.

However, this diametrically opposed running of the vibration systems 110, 120 can also be achieved with a not completely symmetrical design if a bending beam spring with a correspondingly adapted spring constant which is not constant over its length is used. Finally, the dimensioning, type and segmentation of the bending beam spring 135 and thus the value of the spring constant along the second direction determines the deformation of the bending beam spring 135 for a given arrangement of the connection points 140 and a given distribution of forces due to the deflection of the vibration systems 110, 120. Thus, it is possible to enable opposite direction movement of the vibration systems 110, 120 for nearly all possible arrangements of connection points 140 to the substrate 200 and of connections 112, 122 to the vibration systems.

The deformation of the bending beam spring 135 ideally corresponds to a stationary wave the points of maximum deflection of which are located at the connections 112, 122 to the vibration systems 110, 120, and move in a straight line along the first direction.

In particular, the connection between substrate 200, bending beam spring 135 and vibration systems 110, 120 can be configured in such a manner that the first mode of the coupling device 130 thus formed corresponds to the second mode of a freely vibrating bending beam spring 135. This means that the bending beam spring 135 does not form one vibration antinode (first mode of the free bending beam spring) when initiated, but forms two vibration antinodes. In other words, the segments of the bending beam spring 135 located between the connection points vibrate in the first mode of the free bending beam spring, and the bending beam spring 135 composed of the segments thus vibrates in the second mode.

As an alternative to the above description, the central connection point 140 shown shaded in FIGS. 1A and 1B can also be omitted. Also, in this case, a vibration of the bending beam spring 135 can be produced, which couples the vibration systems 110, 120 in push-pull mode. This can be accomplished, for example, by appropriate placement of the connections 112, 122 between the vibration systems 110, 120 and the bending beam spring 135 that favors the formation of the vibration mode in which each vibration system 110, 120 is connected to the bending beam spring 135 in the area of a vibration antinode. Additionally or alternatively, the vibration systems 110, 120 can also vibrate in push-pull mode in such a manner that the vibration frequency is, or is close to, the natural frequency of such a vibration mode. Advantageously, the connections are located in the maximum of the vibration antinodes, i.e., at the points of maximum deflection of the bending beam spring 135.

Further alternatively, instead of two vibration systems 110, 120, a plurality of vibration systems can be coupled by the bending beam spring 135. Then the arrangement or operating frequency of the N vibration systems, for example, must be in such a manner that the bending beam spring forms N vibration antinodes in the area of the respective connections to the vibration systems. This can be supported, for example, by a uniform distribution of the N vibration systems along the length L of the bending beam spring between two connection points 140, where the nth vibration system is located at the position (2n-1) L/(2N) of the bending beam spring 135. Adjacent vibration systems then vibrate in push-pull mode. In the case of two vibration systems 110, 120, this corresponds to the positioning described above at one quarter or three quarters of the length of the bending beam spring between two connection points 140. It is also possible to leave some of the N positions blank. Thus, a coupling can be achieved in which one part of the adjacent vibration system runs in common mode.

Hence, a large number of vibration systems can be coupled in a simple manner using a substantially freely vibrating bending beam spring 135. On the other hand, the variant described above with reference to FIGS. 1A and 1B with intermediate connection of bending beam spring 135 and substrate 200 offers the advantage that the opposite direction coupling vibration mode is formed more simply.

Preferably, in the case of three connections of the bending beam spring 135 to the substrate 200, these are formed as torsion spring elements 132, 134, 136, as depicted schematically in FIG. 2. This allows relative rotation between bending beam spring 135 and substrate 200 in a simple manner, while maintaining a fixed connection to the substrate at the same time.

FIG. 2 schematically shows the formation of torque and forces on the torsion spring elements 132, 134, 136 of the coupling device 130. In doing so, a first torsion spring element 132 is connected to one end of the bending beam spring 135, a second torsion spring element 134 is connected to the center of the bending beam spring 135, and a third torsion spring element 136 is connected to the other end of the bending beam spring 135. Thus, the torsion spring elements 132, 134, 136 are located at the connection points 140 depicted in FIGS. 1A and 1B. The design of the bending beam spring 135 is assumed to be symmetrical to the central, second torsion spring element 134.

The connection 112 to the first vibration system 110 sits between the first and second torsion spring elements 132, 134, and the connection 122 to the second vibration system 120 sits between the second and third torsion spring elements 134, 136. If the first vibration system 110 moves in the positive x-direction, a corresponding force acts on the bending beam spring 135. This is depicted in FIG. 2 with arrow C. This force is transmitted to the first and second torsion spring elements 132, 134 via the bending beam spring 135 and results in a torque therein, causing the torsion spring elements 132, 134 to twist, as depicted in FIG. 2 by rotating arrows.

Similarly, a force in the negative x-direction acts from the second vibration system 120 on the bending beam spring 135, depicted in FIG. 2 with arrow D. This force is also transmitted to the adjacent torsion spring elements 134, 136, causing a torque therein that causes the torsion spring elements 134, 136 to rotate.

In order to now ensure a diametrically opposed deflection of the two vibration systems 110, 120, all torsion spring elements 132, 134, 136 must rotate by the same amount, since otherwise the connections 112, 122 to the vibration systems 110, 120 would no longer perform movements of the same size and in a straight line. This can be ensured by adjusting the spring constants of the torsion spring elements 132, 134, 136 with respect to rotations according to the torque acting on the torsion spring elements 132, 134, 136 when the vibration systems 110, 120 are deflected. The first torsion spring element 132 has a spring constant K1, the second torsion spring element 134 has a spring constant K2, and the third torsion spring element 136 has a spring constant K3 with respect to rotation. If torque M1 acts on the first torsion spring element 132, torque M2 acts on the second torsion spring element 134, and torque M3 acts on the third torsion spring element 136, which are in the ratio of M1:M2:M3, then preferably K1:K2:K3=M1:M2:M3 applies. The torque ratios are therefore equal to the ratios of spring constants with respect to rotation.

In a symmetrical design as shown in FIG. 2, the torque M2 on the central torsion spring element 134 resulting from the acting forces C and D is twice as large as the torque M1, M3 on the outer torsion spring elements 132, 136. In the case of a symmetrical setup of the connections between substrate 200, bending beam spring 135 and vibration systems 110, 120, a ratio of the spring constants of K1:K2:K3=1:2:1 is therefore suitable in order to force a movement of the vibration systems 110, 120 that is as linear and parallel as possible.

Alternatively, linear deflection of the vibration systems 110, 120 can also be ensured with an asymmetrical design by selecting appropriate spring constants.

As explained above, embodiments without the central torsion spring element 134 are also conceivable. This has the advantage that only the two outer torsion spring elements 132, 136 need to be matched to one another for the most uniform deflection possible. For example, it can be sufficient to design the spring constants the same with respect to rotations by making the outer torsion spring elements 132, 136 identical. This further simplifies the setup of the coupling device 130.

In FIGS. 1A to FIG. 2, the connection of the bending beam spring 135 to the substrate is depicted as being punctiform. This is the case when the bending beam spring 135 is designed to be continuous and supported at the connection points 140, for example, by posts that can be twisted in themselves. However, due to the stiffness of the bending beam spring 135 and the typical material of MEMS rotation rate sensors, the bending beam spring 135 cannot then be deflected very far without being damaged.

As an alternative to such a punctiform mounting of a continuous bending beam spring, the bending beam spring 135 can also be interrupted at the connection points 140, in particular, at the central connection point 140 in order to use a torsion spring element 134 which, in addition to rotational movements, can also perform linear movements with respect to the substrate 200. This allows the bending beam spring 135 to be further deflected, as compression of the bending beam spring 135 due to the deflection can be compensated for by a corresponding elongation of the torsion spring element 134.

Figure 3:
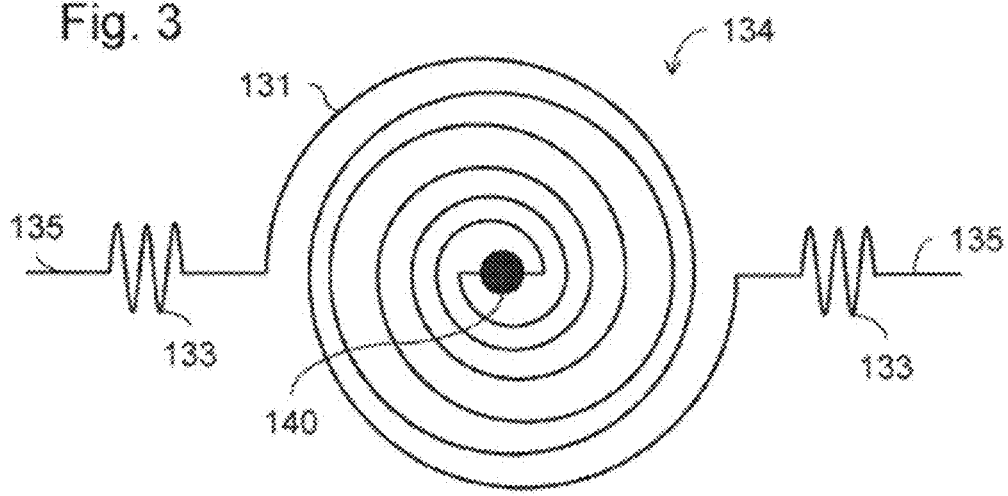
FIG. 3 shows a schematic diagram of a torsion spring element.

FIG. 3 is a schematic diagram of such a torsion spring element 134. In FIG. 3, the ability for rotational movement is depicted by the coil spring 131 connected to the substrate 200 at the connection point 140. The possibility for linear movement is depicted by the two linear springs 133, which are joined by the bending beam spring 135. These are only simplified illustrations for explaining the function of the torsion spring element 134. The concrete implementation of the corresponding components can be carried out in many ways, which are known to a person skilled in the art. In particular, pure torsion springs and pure linear springs are known in the field of MEMS. The combination of these two principles in a torsion spring element 134 is advantageous here.

FIG. 3 shows the torsion spring element in the undeflected state, as also shown in FIG. 1A. The coil spring 131 is not twisted, and the linear springs 131 are neither contracted nor stretched. If deflection now occurs, as shown in FIG. 2, the spiral spring 131 rotates around the connection point 140 in such a manner that the left linear spring 133 moves upward and the right linear spring 133 moves downward. At the same time, the bulging of the bending beam spring 135 in the area of the connections 112, 122 to the vibration systems 110, 120 stretches the linear springs 133, since the compression of the bending beam spring causes a tensile force on the torsion spring element 134.

The linear springs 133—or the possibility of linear movements by the torsion spring element 134—make the length of the bending beam spring 135, which is composed of several segments, variable. As a result, larger deflections of, for example, more than 2 µm, 5 µm, 10 µm, 15 µm or 20 µm can be achieved, increasing the sensitivity of the rotation rate sensor 100.

Such linear springs for changing the length of the bending beam spring 135 can also be part of the bending beam spring 135. It then has sections that can deform perpendicular to the actual main deflection direction, i.e., perpendicular to the x-direction, such as bifurcations of the bending beam spring 135 and/or sections of the bending beam spring 135 running in parallel.

By dividing the bending beam spring 135 into several segments separated by torsion spring elements 134, the mode of vibration of the bending beam spring 135 can deviate from that of a stationary wave. To prevent this, it is advantageous to design the torsion spring elements 134 as small as possible, e.g., with a size less than 1000 µm, 500 µm, 150 µm, 100 µm, 50 µm, 30 µm, 10 µm or 5 µm. In doing so, the size of the torsion spring element 134 can be defined as the diameter of a circle into which the torsion spring element 134 can be fitted or the distance between the segments of the bending beam spring 135 connected by the torsion spring element 134.

Just as the torsion spring elements 132, 134, 136, the connections 112, 122 to the vibration systems 110, 120 can also be obstructive to the vibration of the bending beam spring 135 in the form of a stationary wave. Therefore, it is advantageous if the width of the connections 112, 122 in the y-direction is less than 250 µm, 200 µm, 150 µm, 100 µm, 50 µm, 30 µm, 10 µm, 5 µm or 1 µm to ensure the straightest possible movement of the bending beam spring 135 in the area of the connections 112, 122.

In addition to the coupling device 130 depicted in FIGS. 1A and 1B, the rotation rate sensor 100 can include another coupling device 130 that is built completely analogous to the previously described coupling device 130. This is shown schematically in FIG. 4.

The first and second vibration systems 110, 120 are located in the x-direction between the two coupling devices 130, both of which extend in the y-direction. Thus, the vibration systems 110, 120 are guided at their two ends by the coupling devices 130, which can further improve the linearity and parallelism of the movement.

Figure 4:
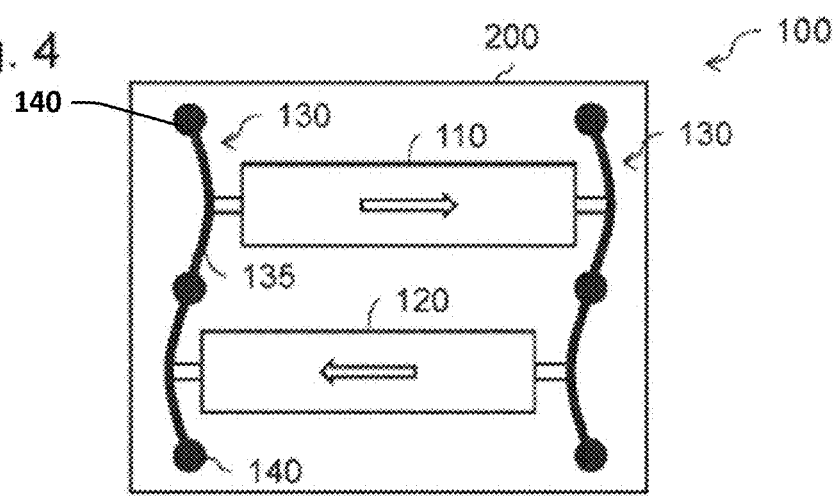
FIG. 4 shows a schematic diagram of a rotation rate sensor.

In FIGS. 1A, 1B and 4, the movement of the vibration systems 110, 120 is depicted in such a manner that the first vibration system 110 and the second vibration system 120 always have the same outer circumference, which moves with respect to the substrate 200. As already mentioned above, this is only a simplified representation that does not have to correspond to the conditions in an actual implementation. Accordingly, the same deflections for both coupling devices 130 in FIG. 4 is also to be understood as purely schematic. Sections of the coupling devices 130 located at the same height in the y-direction need not necessarily have exactly the same deflection if the geometry of the vibration systems 110, 120 requires something else. The decisive factor is that the coupling devices 130 force the vibration systems 110, 120 to move in opposite directions in the x-direction.

Figure 5A:
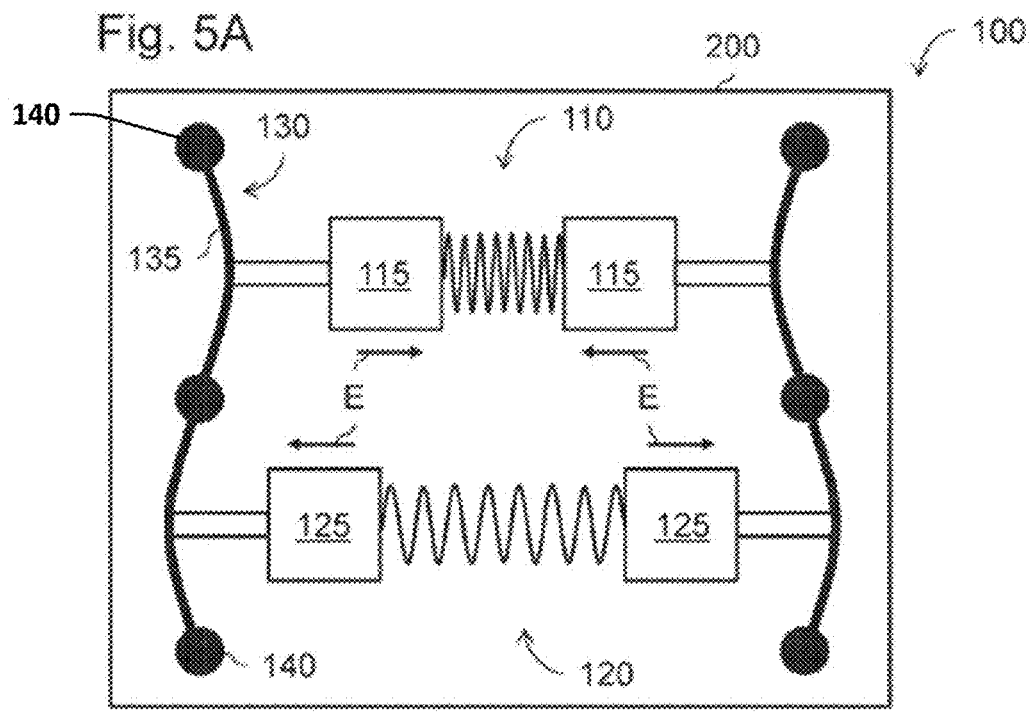
FIGS. 5A and 5B show schematic diagrams of another rotation rate sensor.
Figure 5B:
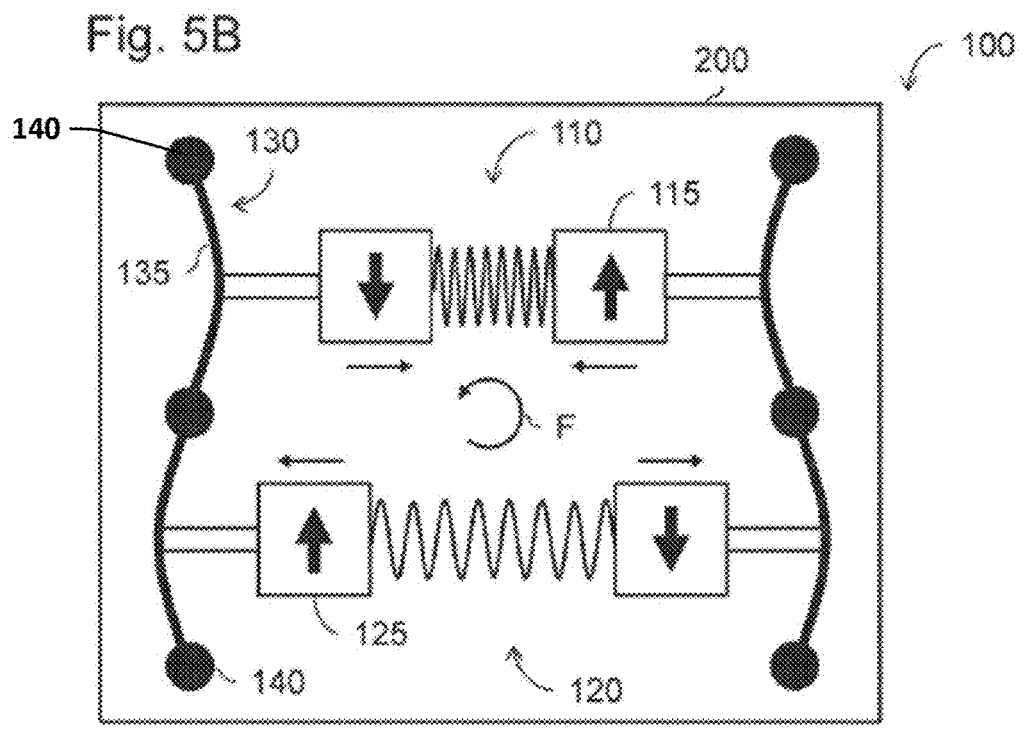

FIGS. 5A and 5B show an embodiment of the vibration systems 110, 120 that can be used in quad mass sensors. The first vibration system 110 has two masses 115 that vibrate against one another in push-pull mode along the x-direction. Similarly, the second vibration system has two masses 125 vibrating against one another in push-pull mode along the x-direction. The first vibration system 110 and the second vibration system 120 each form dual mass sensors the coupling and detailed structure of which are known to a person skilled in the art and need not be further explained here.

An advantage of using dual mass sensors, such as those shown in FIGS. 5A and 5B, is that forces caused by the vibrations, such as spring forces, compensate for one another within the dual mass sensor, i.e., for each force there is an equal but oppositely directed force.

However, it cannot be ruled out that, due to the forces acting, there is torque that is not fully compensated for. To solve this problem, the masses 115 of the first vibration system 110 and the masses 125 of the second vibration system 120 also vibrate in push-pull mode. If the masses 115 of the first vibration system 110 move inwardly, the masses 125 of the second vibration system 120 perform a movement outwardly and vice versa, as indicated by arrows E in FIG. 5A.

The advantage of this arrangement can be taken from FIG. 5B. If the rotation rate sensor 100 is subject to rotation around an axis perpendicular to the image plane (symbolized by arrow F in FIG. 5B), a Coriolis force acts on the masses 115, 125. As depicted schematically in FIG. 5B, this is directed downward for counterclockwise rotation for masses running to the right and upward for masses running to the left. The resulting Coriolis force can be measured, for example, by detecting the deflection of the masses from the purely linear movement by capacitors or by determining the electrical voltage that must be applied to capacitors via a control loop in order to avoid deviation from the linear movement in the x-direction. This exact method of determining the Coriolis force and the resulting derivation of the rotation rate are known per se and need not be discussed further here.

Since the respective masses 115, 125 of a vibration system 110, 120 are located to the left and right of the center of the vibration system 110, 120, the forces acting on the two masses produce torque of the same direction. Therefore, a single vibration system or a single dual mass sensor is force-free, but not necessarily torque-free.

The vibration systems 110, 120 in the quad mass arrangement of FIGS. 5A and 5B are built identically and vibrate in push-pull mode. The torque caused by the Coriolis force in the two vibration systems 110, 120 is therefore (in the case of time averaging over a vibration period) exactly diametrically opposed, i.e., of the same magnitude but of opposite direction. As a result, quad mass sensors are force and torque-free.

However, this is only achieved for substantially parallel and straight-line vibration of the masses 115, 125 of the two vibration systems 110, 120. For this reason, the use of coupling devices 130, as described above, is particularly advantageous for quad mass sensors, as they are capable of forcing both vibration systems 110, 120 onto the advantageous parallel and linear trajectories. In particular, the use of bending beam springs 135, which are connected to the torsion spring elements 132, 134, 136 described above in such a manner that the bending beam spring 125 vibrates in the form of a stationary wave when the vibrations of the vibration systems 110, 120 are initiated is advantageous, since the vibration systems 110, 120 can then be guided in the maxima of the stationary wave, which move exclusively along the x-direction. In this way, robust, reliable, and highly accurate rotation rate sensors 100 can be provided.

The invention claimed is:

1. A micro-electro-mechanical component, preferably an inertial sensor, more preferably a rotation rate sensor for measuring a rotation of the rotation rate sensor, comprising:
a coupling device for coupling a plurality of vibration systems, which are mounted above a substrate in such a manner that said systems can vibrate along a first direction (x) and are offset with respect to one another in a second direction (y) perpendicular to the first direction (x), wherein the coupling device has a bending beam spring which can bend in the first direction (x) and is connected to the vibration systems, and connections of the bending beam spring to the vibration systems are arranged between two connection points of the bending beam spring to the substrate in such a manner that a deflection of the bending beam spring which is caused by movements of the vibration systems results in a vibration of the bending beam spring with vibration antinodes in the area of the connections of the bending beam spring to the vibration systems; and
the plurality of vibration systems; wherein
the number of vibration systems is N;
a length of the bending beam spring between two connection points to the substrate is L; and
the vibration system n (n=1, . . . , N) is connected to the bending beam spring at $(2n-1)\cdot L/(2N)$.

2. The micro-electro-mechanical component of claim 1, wherein no further connection points to the substrate are located between the two connection points between which the length L is defined.

3. A micro-electro-mechanical component, preferably an inertial sensor, more preferably a rotation rate sensor for measuring a rotation of the rotation rate sensor, comprising:
a coupling device for coupling a plurality of vibration systems, which are mounted above a substrate in such a manner that said systems can vibrate along a first direction (x) and are offset with respect to one another in a second direction (y) perpendicular to the first direction (x), wherein the coupling device has a bending beam spring which can bend in the first direction (x) and is connected to the vibration systems, and connections of the bending beam spring to the vibration systems are arranged between at least two connection points at the ends of the bending beam spring that connects the bending beam spring to the substrate in such a manner that a deflection of the bending beam spring which is caused by movements of the vibration systems results in a vibration of the bending beam spring with vibration antinodes in the area of the connections of the bending beam spring to the vibration systems; and
a first vibration system and a second vibration system; wherein
the coupling device is connected to the substrate at three connection points and is connected to the first vibration system between one pair of adjacent connection points and is connected to the second vibration system between the other pair of adjacent connection points the coupling device further includes first, second and third torsion spring elements;

the first torsion spring element is arranged at a first end of the bending beam spring, the second torsion spring element is arranged at the center of the bending beam spring, and the third torsion spring element is arranged at a second end of the bending beam spring to the substrate;

the first vibration system is connected to the bending beam spring midway between the first and second torsion spring elements, and the second vibration system is connected to the bending beam spring midway between the second and third torsion spring elements; and in the case of an opposite direction deflection of the first and second vibration systems along the first direction (x), a second mode of the bending beam spring forms as a first mode of the coupling device, thereby forcing the first and second vibration systems to move in parallel.

4. The micro-electro-mechanical component according to claim 3, wherein, in the case of opposite direction vibrations of the first vibration system and the second vibration system along the first direction (x), the coupling device forces them to move in push-pull mode, preferably, in parallel.

5. The micro-electro-mechanical component according to claim 3, wherein the coupling device forces the first and second vibration systems to vibrate with amplitudes and phases equal in magnitude, but in opposite directions.

6. The micro-electro-mechanical component according to claim 3, wherein the movement of the bending beam spring corresponds to a stationary wave with fixed end points and a fixed center point.

7. The micro-electro-mechanical component according to claim 3, wherein, in the case of an opposite direction deflection of the first and second vibration systems, a first torque M1 abuts the first torsion spring element, a second torque M2 abuts the second torsion spring element, and a third torque M3 abuts the third torsion spring element;

the first torsion spring element includes a first spring constant K1 with respect to rotations, the second torsion spring element includes a second spring constant K2 with respect to rotations, and the third torsion spring element includes a third spring constant K3 with respect to rotations; and the following relationship applies: M1: M2: M3=F1: F2: F3.

8. The micro-electro-mechanical component according to claim 3, wherein the first and third torsion spring elements have the same spring constant K1=K3 with respect to rotations; and the second torsion spring element has a spring constant K2 with respect to rotations which is twice as large as the spring constant of the first and third torsion spring elements, i.e., K1: K2: K3=1:2:1 applies.

9. The micro-electro-mechanical component according to claim 3, wherein the torsion spring elements can be twisted with respect to the substrate, as well as moved linearly with respect to the substrate.

10. The micro-electro-mechanical component according to claim 3, wherein the torsion spring elements have a size of less than 1000 µm.

11. The micro-electro-mechanical component according to claim 3, wherein connections between the first and second vibration systems and the coupling device along the second direction (y) have a width that is less than 250 µm.

12. The micro-electro-mechanical component according to claim 3, further comprising:

an additional coupling device which is identical in construction to the coupling device; wherein the first and second vibration systems are arranged between the two coupling devices along the first direction (x), and the two coupling devices are connected to the first and second vibration systems in the same manner.

13. The micro-electro-mechanical component according to claim 3, wherein the first and second vibration systems each have two masses that can be initiated to vibrate in opposite directions along the first direction (x);

a rotation with vibration initiated along the first direction (x) releases a Coriolis force acting on the masses along the second direction (y), the magnitude of which can be measured to infer the rate of rotation; and the first and second vibration systems have an identical and symmetrical structure, due to which the micro-electro-mechanical component as a whole is free of force and torque in the time average with the initiation of the vibrations of the masses.

14. A micro-electro-mechanical component, preferably an inertial sensor, more preferably a rotation rate sensor for measuring a rotation of the rotation rate sensor, comprising:

a coupling device for coupling a plurality of vibration systems, which are mounted above a substrate in such a manner that said systems can vibrate along a first direction (x) and are offset with respect to one another in a second direction (y) perpendicular to the first direction (x), wherein the coupling device has a bending beam spring which can bend in the first direction (x) and is connected to the vibration systems, and connections of the bending beam spring to the vibration systems are arranged between at least two connection points of the bending beam spring to the substrate in such a manner that a deflection of the bending beam spring which is caused by movements of the vibration systems results in a vibration of the bending beam spring with vibration antinodes in the area of the connections of the bending beam spring to the vibration systems; and a first vibration system and a second vibration system; wherein the coupling device is connected to the substrate at three connection points and is connected to the first vibration system between one pair of adjacent connection points and is connected to the second vibration system between the other pair of adjacent connection points the coupling device further includes first, second and third torsion spring elements each having a size of less than 1000 µm;

the first torsion spring element is arranged at a first end of the bending beam spring, the second torsion spring element is arranged at the center of the bending beam spring, and the third torsion spring element is arranged at a second end of the bending beam spring to the substrate;

the first vibration system is connected to the bending beam spring midway between the first and second torsion spring elements, and the second vibration system is connected to the bending beam spring midway between the second and third torsion spring elements; and in the case of an opposite direction deflection of the first and second vibration systems along the first direction (x), a second mode of the bending beam spring forms as a first mode of the coupling device, thereby forcing the first and second vibration systems to move in parallel.

* * * * *